US007005795B2

(12) United States Patent
Pickard et al.

(10) Patent No.: US 7,005,795 B2
(45) Date of Patent: Feb. 28, 2006

(54) ELECTRON BOMBARDMENT OF WIDE BANDGAP SEMICONDUCTORS FOR GENERATING HIGH BRIGHTNESS AND NARROW ENERGY SPREAD EMISSION ELECTRONS

(75) Inventors: Daniel S. Pickard, Palo Alto, CA (US); R. Fabian W. Pease, Stanford, CT (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 68 days.

(21) Appl. No.: 10/007,631

(22) Filed: Nov. 9, 2001

(65) Prior Publication Data

US 2003/0089912 A1 May 15, 2003

(51) Int. Cl.
*H01J 1/62* (2006.01)
*H01J 63/04* (2006.01)

(52) U.S. Cl. ............... 313/495; 313/496; 313/497; 313/524; 313/542; 313/544; 313/539

(58) Field of Classification Search ........ 313/495–497, 313/524, 530, 541, 542, 544, 539, 523; 330/44–46; 315/39.57, 349, 169.1
See application file for complete search history.

(56) References Cited

U.S. PATENT DOCUMENTS

| 4,993,033 A |   | 2/1991  | Lin ........................ 372/30 |
|-------------|---|---------|-------------------------------------|
| 5,592,053 A |   | 1/1997  | Fox et al. ................. 315/3   |
| 5,680,008 A |   | 10/1997 | Brandes et al. ......... 313/533     |
| 5,684,360 A | * | 11/1997 | Baum et al. ............ 313/542     |
| 5,986,387 A |   | 11/1999 | Niigaki et al. ......... 313/103     |
| 6,005,351 A |   | 12/1999 | Sverdrup et al. ...... 315/169.1     |
| 6,060,839 A |   | 5/2000  | Sverdrup, Jr. et al. ... 315/160     |
| 6,091,186 A | * | 7/2000  | Can et al. ............. 313/310     |
| 6,100,639 A |   | 8/2000  | Sverdrup, Jr. et al. ... 315/169.3   |

OTHER PUBLICATIONS

A.W. Baum, Doctoral Thesis, Stanford University Department of Applied Physics, Stanford, California 1997.
L. Diedrich, et al., "Electron Emission and NEA from Differently Terminated, Doped and Oriented Diamond Surfaces," Diamond and Related Materials, 8, 1999, pp. 743-747.
R. Kalish, "Doping of Diamond", Carbon, 37, 1999, pp. 781-785.

\* cited by examiner

*Primary Examiner*—Tom Thomas
*Assistant Examiner*—Joseph Nguyen
(74) *Attorney, Agent, or Firm*—Lumen Intellectual Property Services, Inc.

(57) ABSTRACT

A semiconductor source of emission electrons which uses a target of a wide bandgap semiconductor having a target thickness measured from an illumination surface to an emission surface. The semiconductor source is equipped with an arrangement for producing and directing a beam of seed electrons at the illumination surface and a mechanism for controlling the energy of the seed electrons such that the energy of the seed electrons is sufficient to generate electron-hole pairs in the target. A fraction of these electron-hole pairs supply the emission electrons. Furthermore, the target thickness and the energy of the seed electrons are optimized such that the emission electrons at the emission surface are substantially thermalized. The emission of electrons is further facilitated by generating negative electron affinity at the emission surface. The source of the invention can take advantage of diamond, AlN, BN, $Ga_{1-y}Al_yN$ and $(AlN)_x(SiC)_{1-x}$, wherein $0 \leq y \leq 1$ and $0.2 \leq x \leq 1$ and other wide bandgap semiconductors.

26 Claims, 3 Drawing Sheets

ELECTRON BOMBARDMENT OF WIDE BANDGAP SEMICONDUCTORS FOR GENERATING HIGH BRIGHTNESS AND NARROW ENERGY SPREAD EMISSION ELECTRONS

FIELD OF THE INVENTION

This invention relates to wide bandgap semiconductor sources of emission electrons obtained through electron bombardment of a wide bandgap semiconductor target.

BACKGROUND OF THE INVENTION

Numerous important devices require for their operation a supply of electrons and, more specifically, electrons delivered in the form of a beam. For example, a Scanning Electron Microscope (SEM) uses a focused electron beam to examine objects and a cathode ray tube (CRT) type image display uses directed beams of electrons to illuminate its typically phosophor-containing pixels. Other displays, e.g., flat panel displays of the Field Emission Display (FED) type also use electron beams. Lithographic and metrologic machines also use electron beams. Yet other devices are used to amplify electron beams.

The prior art teaches devices capable of emitting electrons that can be delivered or focused in the form of a beam as well as devices which can amplify incident electron beams. These devices include cathodes, photocathodes, thermionic emission devices, vacuum tubes, field emission devices, semiconductor electron beam emitters and others. Recent requirements for high brightness (defined as current density per solid angle) and narrow energy spread of the electrons constituting the beam seriously limit the applicability of many of these devices. In particular, many applications such as high resolution SEM, high definition lithography as well as displays would benefit from robust high brightness source operating at 10 keV fields, or fields of higher and lower values, and yielding brightness values of $10^5$ A/cm$^2$/sterdian and an energy spread of less than 1 eV and preferably less than 0.1 eV.

Standard cathodes are not capable of delivering such high brightness beams with the requisite narrow energy spread because the electron emission conditions in a typical cathode are difficult to control, inherently noisy and the cathodes are not sufficiently robust. In the case of photocathodes, photocathodes that operate with available light sources and optics are very sensitive to contamination. Photocathodes which promise to be more robust lack available light sources delivering photons of apropriate energy to operate the photocathodes to produce such high brightness and narrow energy spread electron beams. Thermionic emission devices have lower brightness and larger energy spread. Field emission devices are difficult to control, noisy and also can not satisfy the robustness requirements in that they must be operated at very high vacuum to maintain a clean environment for the emitters. Another serious problem with field emission devices used in displays is that reverse ion bombardment damages the emitter. Another problem is that electric fields near breakdown limits are required for the desired current output in the attempt to increase brightness. Such large fields result in reduced lifetime of the emitter.

Electron beam emitters and amplifiers using semiconductor materials promise to deliver higher brightness electron beams. A semiconductor electron beam device operates on the principle that a semiconducting material will normally have a low electrical conductivity impeding the flow of an electrical signal therethrough. Electrical carriers, however, can be generated in the semiconductor material in response to electron bombardment. For example, in U.S. Pat. No. 5,592,053 Fox et al. recognize that diamond, which is a wide bandgap semiconductor, can be used as a target in an electron beam device and be made to conduct electrical current, thus acting as an amplifier. There are numerous additional references on the subject of using diamonds for electron emission, such as U.S. Pat. No. 4,993,033 to Lin, which teaches the use of diamond rendered conductive by an electron beam in a high power fast switch. In other words, the generation of electrical carriers, such as electron-hole pairs, under electron bombardment increases the conductivity of the semiconducting material allowing the passage of an electrical signal therethrough.

It is known that improved performance in electron emission from a semiconductor emitting surface can be obtained by a condition of negative electron affinity (NEA) at the emitting surface. Surfaces which exhibit NEA will promote the emission of electrons which are close to the emission surface. For more information on this subject of NEA and appropriate processing and doping of semiconductors for photocathodes the reader is referred to A. W. Baum, Doctoral Thesis, Stanford University Department of Applied Physics, Stanford, California 1997; and for diamonds in particular to L. Diedrich, et al., "Electron Emission and NEA from Differently Terminated, Doped and Oriented Diamond Surfaces", Diamond and Related Materials, 8, 1999, pp. 743–747; R. Kalish, "Doping of Diamond", Carbon, 37, 1999, pp. 781–785 further discusses appropriated doping of diamond and many other references. In fact, many of the above-described prior art devices use NEA to generate electron emission.

Noteworthy examples of the use of semiconductors in electron beam emitters and amplifiers include U.S. Pat. No. 5,680,008 to Brandes et al. which teaches the use of compact low-noise dynodes incorporating semiconductor secondary electron emitting materials to amplify a signal by amplifying an electron beam in numerous stages. The Brandes dynodes are essentially electron multipliers which amplify the signal generated by an incident particle. In U.S. Pat. No. 5,986,387 Niigaki et al. teach a transmission type electron multiplier and electron tube. This device has a high secondary electron generation efficiency and uses a thin film of diamond as the semiconductor. In U.S. Pat. Nos. 6,005,351; 6,060,839 and 6,100,639 Sverdrup, Jr. et al. teach the use of thin diamond semiconductors for secondary electron beam emission and their use in electron beam amplifiers as well as flat panel displays.

Unfortunately, despite all attempts, none of the above described sources and/or amplifiers of electron beams are capable of satisfying the requirements of high brightness, narrow energy spread and robustness at the same time. Specifically at electric fields of 10 keV a brightness of more than $10^5$ A/cm$^2$/sterdian and an energy spread of less than 1 eV and preferably less than 0.1 eV and robustness is not achievable with these prior art sources. Therefore, what is needed is a robust source which does not require a high vacuum for delivering an electron beam of high brightness and narrow energy spread.

OBJECTS AND ADVANTAGES

In view of the above, it is a primary object of the present invention to provide a robust source of electrons in a beam of high brightness and low energy spread. More particularly, it is an object of the invention to provide a wide bandgap semiconductor source of emission electrons which yields an electron beam with brightness values at 10 keV of more than $10^5$ A/cm$^2$/sterdian and an energy spread of less than 1 eV and preferably less than 0.1 eV.

It is a further object of the invention to ensure that the source is robust and resistant to the surrounding environment. In particular, the source is preferably capable of operating under less stringent vacuum conditions and is generally less sensitive to contamination.

Yet another object of the invention is to provide an electron beam source which is easy to use, efficient and low-cost.

These and other objects and advantages of the invention will become apparent upon reading the ensuing description.

SUMMARY

The objects and advantages of the invention are achieved by a semiconductor source of emission electrons which uses a target of a wide bandgap semiconductor. The target has a target thickness measured from an illumination surface to an emission surface. The semiconductor source is equipped with an arrangement for producing and directing a beam of seed electrons at the illumination surface of the target and a mechanism for controlling the energy of the seed electrons. Specifically, the energy of the seed electrons is controlled such that the seed electrons generate electron-hole pairs in the target and a fraction of these electron-hole pairs supply the emission electrons. Furthermore, the target thickness and the energy of the seed electrons are optimized such that the emission electrons at the emission surface are substantially thermalized.

The surface of the wide bandgap semiconductor is modified so as to have a negative electron affinity (NEA) at the emission surface. Materials which can be modified to exhibit NEA at the emission surface include, among others, diamond, AlN, BN, $Ga_{1-y}Al_yN$ and $(AlN)_x(SiC)_{1-x}$, wherein $0 \leq y \leq 1$ and $0.2 \leq x \leq 1$. In a preferred embodiment diamond is used as the semiconductor and the emission surface has NEA by being hydrogen-terminated. Other material coatings for generating NEA both in diamond and other semiconductors can also be used. In one embodiment the semiconductor is diamond and NEA at the emission surface is generated by a material coating containing Cs and O.

The semiconductor source of emission electrons is preferably equipped with a mechanism for producing and directing a beam of the emission electrons leaving the emission surface. For example, an external applied electric field functions to draw the emission electrons from the emission surface and form the beam. In the same or another embodiment an external applied magnetic field is used for forming and directing the beam. A person skilled in the art will recognize that apertures and other mechanisms can also be used to help form and direct the beam of emission electrons.

The collection of electrons generated by the seed electron beam can be enhanced by providing an electric field within the semiconductor. For example, a built-in electric field produced by a bandgap ramp extending from within the target to the emission surface can be used to help draw the emission electrons to the emission surface. It should be noted that a bandgap ramp will not be applicable in cases where diamond is chosen as the semiconductor. The external applied electric field set up to penetrate the target can achieve a similar result. The field penetration is applicable with all semiconductors and will exhibit various degrees of effectiveness depending on doping concentrations and other well-known characteristics of the semiconductor chosen.

The target thickness and the energy of the seed electrons are adjusted such that the emission electrons undergo substantial thermalization, i.e., such that most emission electrons occupy the lowermost portion of the conduction band by the time they arrive at the emission surface. Under this condition the emission electrons drawn off the emission surface will exhibit an energy spread of about 1 eV or less. In a preferred embodiment the target thickness and energy of seed electrons are selected such that the thermalization of emission electrons at the emission surface is so close to complete that the energy spread of emission electrons is about 0.1 eV and most preferably even less.

The arrangement for producing and directing the beam of seed electrons can include any suitable arrangement capable of delivering the seed electrons at energy levels sufficient to produce an appreciable number of electron-hole pairs in the target, e.g., in the 1 keV to 10 keV range and more, depending on the thickness of the target. For example, the arrangement can include a photocathode and a light source for illuminating the photocathode to photoinduce generation of the seed electrons. The photocathode can be an NEA photocathode to facilitate the emission of seed electrons. The arrangement preferably also has a voltage source for applying an electric field to the seed electrons and/or a unit for applying a magnetic field to the seed electrons. The application of the electric and magnetic fields to seed electrons enables one to better collimate the seed electrons into a beam and better direct this beam at the illumination surface of the target.

In alternative embodiments the source of seed electrons is selected from among field emission sources, thermionic sources, thermal field emission sources and any other suitable sources. Once again, the arrangement for producing and directing the beam of seed electrons can include voltage sources for applying an electric field to the seed electrons and/or units for applying a magnetic field to the seed electrons.

The invention further provides a method for obtaining emission electrons from the target by controlling the energy of the seed electrons and selecting the thickness of the target. These two parameters are adjusted such that the emission electrons from the fraction of the electron-hole pairs which provide them, are substantially thermalized at the emission surface. The more complete the thermalization of emission electrons at the emission surface, the smaller the energy spread of the emission electrons in the beam of emission electrons. It is also important that the target thickness is thin enough to prevent significant electron-hole recombination, which acts to reduce the number of available emission electrons.

In accordance with the method, the emission electrons are drawn off the emission surface and formed to a beam. The beam is directed to an application unit such as a scanning electron microscope or a display unit, e.g., an image display unit. Of course, other application units such as devices for lithography, metrology, electron beam amplification and others can also take advantage of the beam of emission electrons produced by the semiconductor source of the invention. The specifics of the invention will now be explained in more detail in the following detailed description with reference to the attached drawing figures.

DETAILED DESCRIPTION

Figure 1:
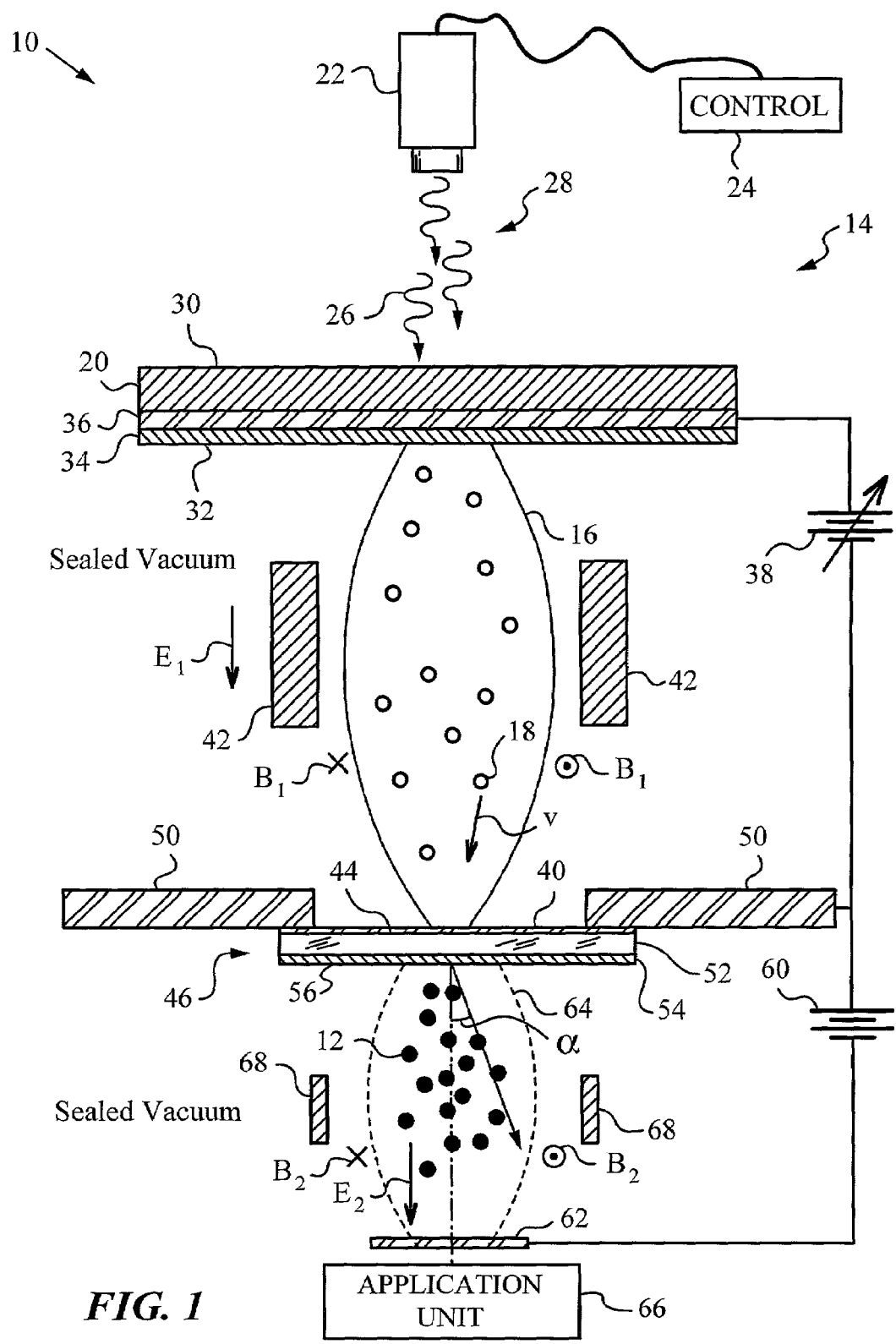
FIG. 1 is a plan schematic diagram of a preferred embodiment of a wide bandgap semiconductor source of emission electrons.

FIG. 1 illustrates in a plan schematic diagram a preferred embodiment of a wide bandgap semiconductor source 10 of emission electrons 12. Source 10 has an arrangement 14 for producing and directing a beam 16 of seed electrons 18 at a target 46 mounted on a stage 50. Target 46 contains a layer of wide bandgap semiconductor 52 selected to produce and release emission electrons 12 under bombardment with beam 16 of seed electrons 18. For the purposes of this invention wide bandgap semiconductor 52 has a bandgap of at least 1.9 eV.

In the present embodiment, arrangement 14 includes a photocathode 20 and a light source 22 controlled by a control unit 24. Light source 22 can be a laser, a lamp or any other suitable source capable of producing photons 26 of sufficient energy to cause photoinduced generation of seed electrons 18 in photocathode 20 upon illumination with a light beam 28 containing photons 26. It will be appreciated by a person skilled in the art that any appropriate optics (not shown) can be used for directing and focusing light beam 28 onto an illumination surface 30 of photocathode 20.

Photocathode 20 can be any standard photocathode capable of emitting seed electrons 18 which can be accelerated to the requisite energies for bombardment of target 46. However, it is preferable that photocathode 20 be a negative electron affinity (NEA) photocathode. As is known, materials exhibiting NEA have a conduction band energy which falls below the vacuum energy at the material surface, thus facilitating the emission of seed electrons 18 from the conduction band. Therefore, photocathode 20 is preferably made of a material which exhibits NEA. Alternatively, photocathode 20 has provisions for rendering at least an emission surface 32 from which seed electrons 18 are emitted to exhibit NEA. In the present embodiment, photocathode 20 is made of an NEA material such as GaAs with Cs and O coating for producing NEA.

Arrangement 14 for producing and directing beam 16 further includes a cathode layer 36, a tunable voltage source 38 and an electrode 40. Voltage source 38 is connected between cathode layer 36 and electrode 40 via target stage 50 which holds target 46. Voltage source 38 applies a potential difference between cathode layer 36 and electrode 40. The potential difference sets up an electric field, indicated by arrow $E_1$, used for drawing seed electrons 18 from surface 32 of NEA photocathode 20 and accelerating seed electrons 18 towards electrode 40. Arrangement 14 is also equipped with a unit 42 for applying a magnetic field to seed electrons 18. As a person skilled in the art will appreciate, that any suitable coil magnets or permanent magnets, e.g., units analogous to those used as yokes in guiding electron beams in CRT displays, can serve the function of unit 42. The direction of the magnetic field is selected to apply a force to deflect or focus electrons 16 depending on their velocity in accordance with well-known principles. In the present embodiment, magnetic field $B_1$ points into the page on the left side of beam 16 and out of the page on the right side of beam 16. This configuration of magnetic field $B_1$ deflects seed electrons 18 traveling at a velocity v towards the center of beam 16. Alternatively, depending on the requirements for guiding beam 16, an axial magnetic field or a field exhibiting a certain gradient can be used by itself, or in combination with additional electric field(s) as is well known to those skilled in the art.

It is preferable that the space between photocathode 20 and target 46 be evacuated. In particular, the space between photocathode 20 and target 46 is preferably held in a sealed vacuum sufficiently low to not interfere with the propagation of seed electrons 18. The vacuum should keep out any contaminants likely to degrade photocathode 20 and/or target 46. A vacuum of about $10^{-7}$ torr will be sufficient with many standard photocathodes, but in the case of GaAs photocathode 20 and Cs and O coating a higher vacuum, e.g., $10^{-9}$ torr or even higher, should be maintained in order to prevent degradation of the coating. Such vacuum can be obtained in a sealed tube, as is known in the art.

Electric field $E_1$ and magnetic field $B_1$ are used in accordance with well-known principles of electricity and magnetism to collimate, focus and direct beam 16 of seed electrons 18 at an illumination surface 44 of target 46. Since electrode 40 is deposited on illumination surface 44 it is very thin and selected from well-known materials which do not affect the passage of seed electrons 18 therethrough. In other words, electrode 40 is an electron transparent electrode. Tunable voltage source 38 is selected such that it can apply sufficient voltage difference between cathode layer 36 and electrode 40 to ensure that seed electrons 16 bombarding illumination surface 44 have a high energy, e.g., in the 1 keV to 10 keV range, or higher. A person skilled in the art will recognize that under some conditions electrode 40 on target 46 may not be necessary to achieve this goal. In the 1 keV to 10 keV energy range seed electrons 18 produce a sufficient number of electron-hole pairs in wide bandgap semiconductor 52, as described in more detail below.

Target 46 is made of wide bandgap semiconductor 52 selected from among materials such as diamond, AlN, BN, $Ga_{1-y}Al_yN$ and $(AlN)_x(SiC)_{1-x}$, wherein $0 \leq y \leq 1$ and $0.2 \leq x \leq 1$ and other materials. When selecting diamond, semiconductor 52 can employ the monocrystalline or polycrystalline form. In fact, it is preferable a p-doped diamond as semiconductor 52. With any choice, semiconductor 52 preferably exhibits NEA. An additional material coating layer 54 containing hydrogen or Cs and O is provided at an emission surface 56 of target 46 to generate NEA in semiconductor 52. Target 46 is designed to generate electron-hole pairs in semiconductor 52 when its illumination surface 44 is bombarded with seed electrons 16.

Figure 2:
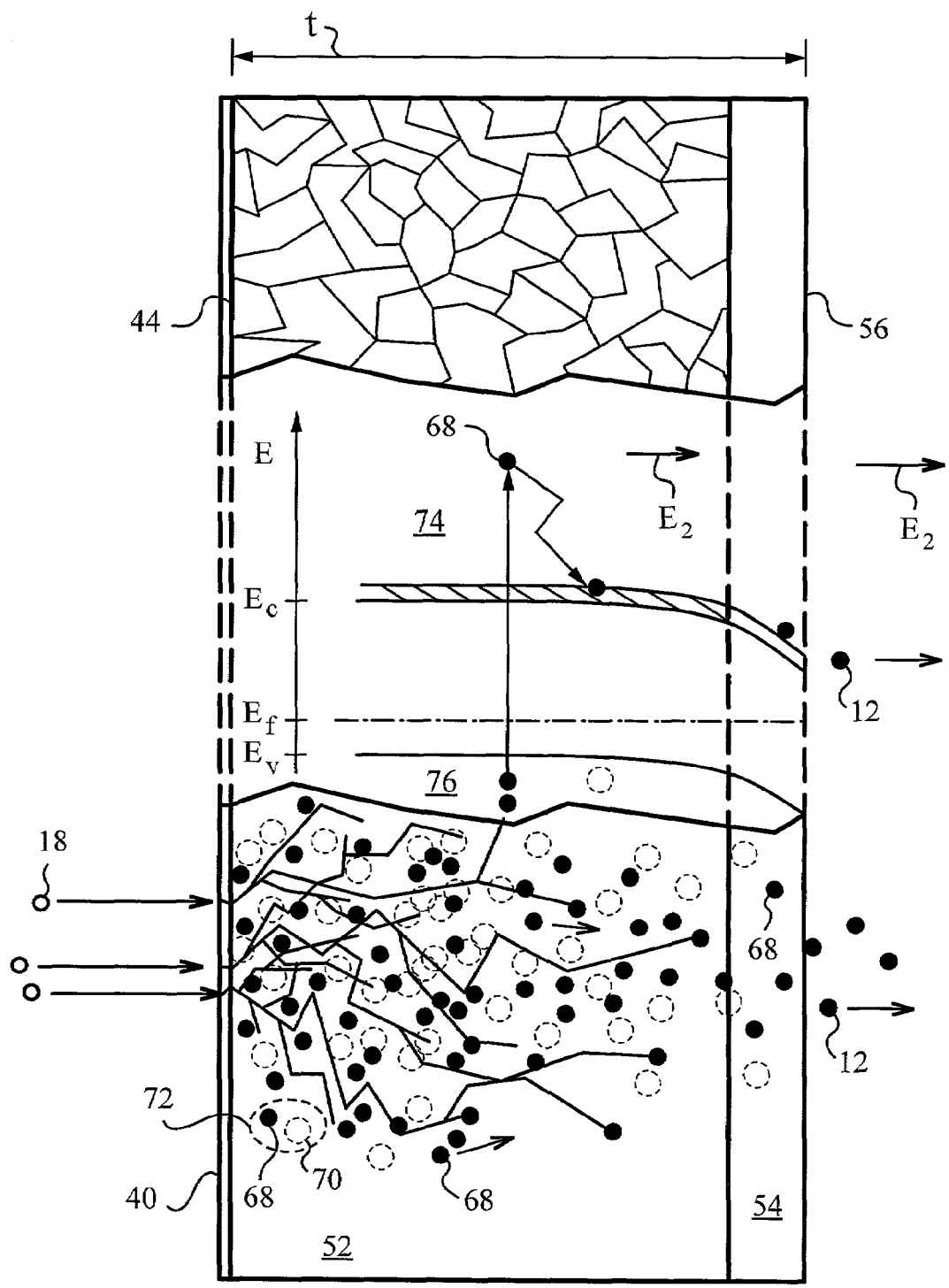
FIG. 2 is a cross-sectional schematic diagram illustrating the processes occurring in the target of the source of FIG. 1.

In a most preferred embodiment material coating 54 is replaced by surface-bonded hydrogen. In particular, semiconductor 52 is treated to produce a hydrogen-terminated emission surface 56. This is particularly advantageous when semiconductor 52 is monocrystalline or polycrystalline diamond, as shown in FIG. 2. Since hydrogen termination is more robust than other coating materials or methods of generating NEA, this embodiment secures the advantage of using diamond, which is an inherently robust semiconductor with the most robust surface additive. Appropriate methods for achieving hydrogen-termination are well-known in the art. Hydrogen-terminated emission surface 56 renders source 10 and more specifically target 46 more robust and resistant to the surrounding environment. In particular, target 46 can operated under less stringent vacuum conditions and can even be transported outside the vacuum environment since semiconductor 52 is rendered less sensitive to contamination by the strong hydrogen bonds at emission surface 56.

A fraction of the electron-hole pairs produced in semiconductor 52 supply emission electrons 12 which are drawn out at emission surface 56 with the aid of an external applied electric field $E_2$. In the present embodiment a voltage source 60 is connected to apply a voltage between electrode 40 and a grid electrode 62 thus setting up electric field $E_2$. Electric field $E_2$ draws out emission electrons 12 from target 46 at emission surface 56 and accelerates them in the form of beam 64 to an application unit 66. A unit 68 for applying a magnetic field $B_2$ is also provided to aid in the guiding and focusing of beam 64. A person skilled in the art will appreciate that in some cases axial or other magnetic fields can be applied instead of field $B_2$. It will also be noted that in some cases magnetic fields $B_1$ and/or $B_2$ will not be required at all in guiding and focusing either beam 16 or beam 64. For example, this can occur when beams 16 and/or 64 only need to traverse short distances.

Once again, it is preferable to maintain a sealed vacuum in the space between target 46 and grid 62 for the same reasons as mentioned above. However, when target 46 uses p-doped diamond as semiconductor 52 with hydrogen-terminated emission surface 56 it is much more robust than the GaAs photocathode 20 with Cs and O coating 54. Thus, a much lower vacuum, e.g., on the order of $10^{-7}$ or less is sufficient. This vacuum may contain additional hydrogen (e.g., $10^{-6}$ or $10^{-7}$ torr partial pressure) to replenish emission surface 56 with hydrogen.

In the present embodiment application unit 66 can be any type of device requiring high brightness and narrow energy spread beam 64 of emission electrons 12. For example, unit 66 is a Scanning Electron Microscope, an electron beam lithography device, a metrological instrument, an electron beam amplifier, an image display unit or any other device requiring electron beam 64. A person skilled in the art will recognize how to adapt the configuration of grid electrode 62 as well as source 60 and unit 68 to any of these applications or other applications requiring beam 64. To obtain beam 64 of high brightness and low energy spread in accordance with the invention it is important that the energy of seed electrons 18 in beam 16 be adjusted. It is also important that the distance between illumination surface 44 and emission surface 56 of target 46 or target thickness t (see FIG. 2) be properly selected in correspondence to the energy of seed electrons 18.

We now refer to FIG. 2, which better illustrates the details of target 46 and the necessary conditions for bombardment by seed electrons 18 of beam 16 to obtain high brightness and low energy spread beam 64. The distance between illumination surface 44 and emission surface 56 defines a target thickness t. Since electrode 40 is transparent to seed electrons 18 and no appreciable generation of electron-hole pairs occurs in electrode 40, thickness t does not take into account electrode 40. For example, electrode 40 is a thin Al coating or gold layer which is crack free.

The energy of seed electrons 18 bombarding illumination surface 44 through electrode 40 is controlled by voltage source 38 such that it is sufficiently high, e.g., in the 1 keV to 10 keV range, to generate a large number of electron-hole pairs 72. Each electron-hole pair 72 consists of one electron 68 promoted into a high energy level within a conduction band 74 of semiconductor 52 and one hole 70 in a valence band 76 of semiconductor 52. The promotion of only one electron 68 into an upper level within conduction band 74 is illustrated in the energy diagram integrated in FIG. 2 for reasons of clarity. In this diagram $E_c$ represents the lowest conduction band energy in conduction band 74, $E_f$ represents the Fermi level, and $E_v$ represents the highest energy level in valence band 76. The bandgap of semiconductor 52 is the difference between $E_c$ and $E_v$.

When the energy of seed electrons 18 is within the preferred range, electron 68 from an electron hole pair 72 has sufficient energy to create additional electron hole pairs 72. In turn, electron 68 from an electron-hole pair 72 thus created generally still has sufficient energy to create additional electron-hole pairs 72. Thus, seed electrons 18 bombarding semiconductor 52 in target 46 cause a large scale "cascade" or "domino effect" and consequent generation of a very large number of electron-hole pairs 72.

A fraction of electron-hole pairs 72 supply emission electrons 12 at emission surface 56. In particular, as shown in the energy diagram on the example of one electron 68, thickness t of target 46 is selected in coordination with the energy of seed electrons 18 and taking into account the electron-hole recombination rate. Specifically, target thickness t is selected such that by the time electron 68 reaches emission surface 56 it is substantially thermalized but has still not had sufficient time to recombine with hole 70. In other words, by the time electron 68 reaches emission surface 56 it is contained in the lowermost (hatched) portion of conduction band 74 but has not had sufficient time to drop back into valence band 76 due to electron-hole recombination. Thermalization is a process by which the energy of electron 68 is reduced through phonon interactions and other interactions with the lattice of semiconductor 52. At room-temperature substantially thermalized electron 68 exhibit an energy spread of about 0.026 eV and even less at lower temperatures. There are other contributions to this energy spread, however, depending on specific conditions as is known in the art. Reported energy spreads are as low as 0.5 eV but less than 0.1 eV can also be achieved. For the purposes of this application substantially thermalized electron 68 exhibits an energy spread of about 1 eV or less and preferably about 0.1 eV or even less.

A certain fraction of electrons 68 from electron-hole pairs 72 become thermalized, as described above, and are drawn off emission surface 56 by electric field $E_2$. Because of NEA of semiconductor 52 at emission surface 56 thanks to hydrogen-termination or Cs and O coating 54, energy bands 74 and 76 are bent near emission surface such that the lowermost portion of conduction band 74 drops below the vacuum energy level (not shown). In other words, there is no energy barrier at emission surface 56 to the emission of emission electrons 12. This condition enables electric field $E_2$ to easily draw off emission electrons 12 from emission surface 56. Because emission electrons 12 are drawn from the available pool of substantially thermalized electrons 68, they exhibit an energy spread which is usually degraded by the Boerch effect. This effect causes the electron energy spread to become somewhat worse in beam 64. A person skilled in the art will know that this effect can be mitigated if emission electrons 12 are accelerated very quickly by external applied electric field $E_2$.

Emission electrons 12 drawn off emission surface 56 produce beam 64 exhibiting a high brightness or current per unit solid angle. Referring back to FIG. 1, emission electrons 12 are drawn off and exhibit a solid angle schematically indicated by α in FIG. 1. The angular distribution is typically Lambertian, or cos α. The emission electrons 12 exhibit a brightness at 10 keV applied field $E_2$ of better than $10^5$ A/cm$^2$/sterdian. In conjunction with the robustness of target 46 and an energy spread of less than 1 eV and preferably less than 0.1 eV this renders semiconductor source 10 an excellent electron beam source for high resolution SEM, display applications, as well as lithography, low-noise amplification, metrological applications and many others. Source 10 is easy to use, efficient and low-cost and robust.

Figure 3:
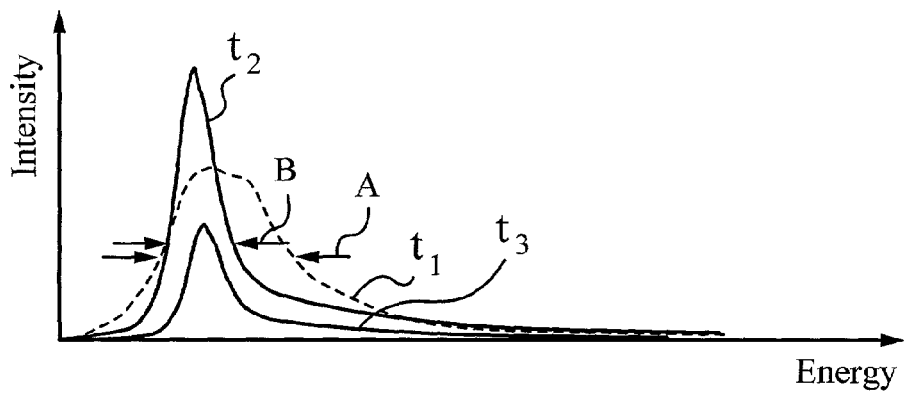
FIG. 3 is a graph illustrating the narrowing of the energy spread of emission electrons by applying the method of the invention.

In optimizing the energy of seed electrons 18 and thickness t of target 46, it is useful to determine the penetration depth of seed electrons 18 inside target 46. The energy of seed electrons 18 is then preferably selected such that seed electrons 18 do not fully penetrate target 46. At the same time, the energy spread of emission electrons 12 can be monitored as a function of thickness t (e.g., by using a wedge-shaped target 46). FIG. 3 illustrates a typical energy spread decrease as thickness t is increased. The dashed graph indicates the energy of emission electrons 12 observed at a first thickness $t_1$ and the solid graph indicates the energy of emission electrons 12 at a larger thickness $t_2$. Both thicknesses $t_1$, $t_2$ are selected to completely prevent the penetration of target 46 by seed electrons 18. Clearly, at thickness $t_2$ the energy spread B is smaller than the energy spread A at thickness $t_1$. Therefore, thickness $t_2$ is selected. As thickness is increased further, e.g., to a still higher value $t_3$, the amount of available emission electrons 12 drops due to electron-hole recombination as shown by the corresponding graph. Hence, the brightness of beam 64 is reduced, making the choice of thickness $t_3$ undesirable.

Semiconductor source 10 of the invention admits of numerous alternative embodiments and modification. For example, in accordance with one modification a built-in electric field bandgap ramp is provided in target 46 when semiconductor 52 is not diamond. Bandgap ramp gradually lowers the conduction band energy in the direction of emission surface 56. Such as in the case of $Ga_{1-y}Al_yN$ wherein $0 \leq y \leq 1$ and y is varies in the direction of desired electron movement, i.e., in the direction toward emission surface 56. Such ramp facilitates the drawing off of emission electrons from inside target 46 to emission surface 56. A person skilled in the art will realize how to provide such bandgap ramp. Alternatively, the collection of electrons 68 generated by the seed electrons 18 can be facilitated by providing an external electric field which penetrates within semiconductor 52. Once again, a person skilled in the art will recognize how to apply this technique.

Figure 4:
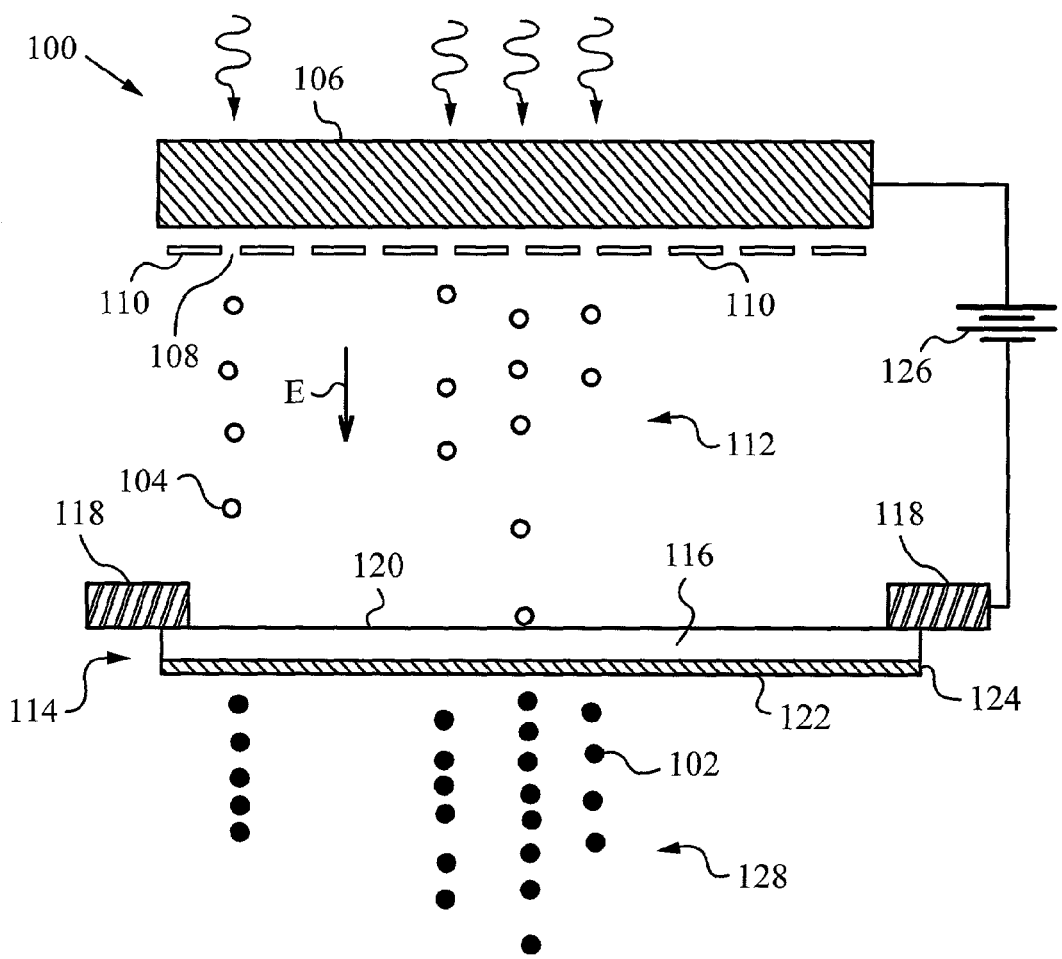
FIG. 4 illustrates a plan schematic view of another embodiment of a wide bandgap semiconductor source of emission electrons.

FIG. 4 illustrates a plan schematic view of another embodiment of a wide bandgap semiconductor source 100 of emission electrons 102. Source 100 uses a photocathode 106 or any other suitable source of seed electrons 104. Suitable alternative sources include field emission sources, thermionic sources, thermal field emission sources and others. In the present embodiment photocathode 106 is stimulated to produce seed electrons 104 at several points by illumination with suitable light sources such as lasers (not shown) at those points from at the opposing surface of photocathode 106.

Apertures 108 are provided between beam guiding devices 110 both of which help to direct beams 112 of seed electrons 104 at a target 114 of a wide bandgap semiconductor 116. An electric field E applied between photocathode 106 and an electrode 118 by a voltage source 126 is used to accelerate seed electrons 104 to impact at an illumination surface 120 of target 114. In this embodiment, electrode 118 also fulfills the function of mounting stage for target 114. The volume between photocathode 106 and target 114 is evacuated, in accordance with the rules described in the embodiment of FIGS. 1 and 2.

Target 114 has an emission surface 122 covered by a coating 124 to produce NEA yields beams 128 of emission electrons 102 in response to beams 112. An additional external field (not shown) is used to collimate and direct beams 128 of emission electrons 102 to the corresponding application. The construction of source 100 is particularly advantageous for applications requiring generation of several electron beams at once, e.g., an array of electrons beams.

It should be noted that the semiconductor source of the invention, when coupled with an NEA GaAs photocathode enables rapid blanking of the beam with cheap red diode lasers as a light source. This presents an advantage in lithography applications where the beam must write and be blanked very rapidly. It also elminates the needs for large number of electrical feedthroughs into the vacuum region to electronically blank the individual beamlets, the blanking being externally performed with the laserws. Thus, the source of invention can secure for these lithographic application the advantage of a photocathode with the robustness of the diamond emitting surface.

A person skilled in the art will recognize that numerous other embodiments and modifications are within the scope of the invention. Therefore, the scope of coverage is to be judged by the appended claims and their legal equivalents.

We claim:

1. A semiconductor source of emission electrons comprising:
   a) a target comprising a wide bandgap semiconductor, said target having a target thickness between an illumination surface and an emission surface of said target; and
   b) a means for producing and directing a beam of seed electrons at said illumination surface;
   c) a means for controlling an energy of said seed electrons such that said seed electrons generate electron-hole pairs in said target and a fraction of said electron-hole pairs supply said emission electrons; and
   wherein said target thickness and the energy of said seed electrons are optimized such that said seed electrons do not fully penetrate said target and said emission electrons are substantially thermalized at said emission surface such that an energy spread of said emission electrons at said emission surface is less than approximately 1 eV.

2. The semiconductor source of claim 1, wherein said wide bandgap semiconductor has a negative electron affinity at said emission surface.

3. The semiconductor source of claim 2, wherein said side bandgap semiconductor comprises a material selected from the group consisting of diamond, AlN, BN, $Ga_{1-y}Al_yN$ and $(AlN)_x(SiC)_{1-x}$, wherein $0 \leq y \leq 1$ and $0.2 \leq x \leq 1$.

4. The semiconductor source of claim 3, wherein said wide bandgap semiconductor is diamond and said emission surface is hydrogen-terminated for generating said negative electron affinity.

5. The semiconductor source of claim 2, wherein said wide bandgap semiconductor comprises a means for generating said negative electron affinity at said emission surface.

6. The semiconductor source of claim 5, wherein said means for generating is a material coating.

7. The semiconductor source of claim 6, wherein said wide bandgap semiconductor is diamond and said material coating comprising Cs and O.

8. The semiconductor source of claim 1, further comprising a means for drawing said emission electrons from within said target to said emission surface.

9. The semiconductor source of claim 8, wherein said means for drawing comprises a built-in electric field induced by a bandgap ramp.

10. The semiconductor source of claim 8, wherein said means for drawing comprises an external applied electric field penetrating said target.

11. The semiconductor source of claim 1, further comprising a means for producing and directing a beam of said emission electrons.

12. The semiconductor source of claim 11, wherein said means for producing and directing comprises an external applied electric field.

13. The semiconductor source of claim 11, wherein said means for producing and directing comprises an external applied magnetic field.

14. The semiconductor source of claim 1, wherein said energy spread is less than 0.1 eV.

15. The semiconductor source of claim 1, wherein said means for producing and directing said beam of seed electrons comprises a photocathode and a light source for photoinduced generation of said seed electrons from said photocathode.

16. The semiconductor source of claim 15, wherein said photocathode comprises a negative electron affinity photocathode.

17. The semiconductor source of claim 15, wherein said means for producing and directing said beam of seed electrons comprises a voltage source for applying an electric field to said seed electrons.

18. The semiconductor source of claim 15, wherein said means for producing and directing said beam of seed electrons comprises a unit for applying a magnetic field to said seed electrons.

19. The semiconductor source of claim 1, wherein said means for producing and directing said beam of seed electrons comprises a source selected from the group consisting of field emission source, thermionic source and thermal field emission source.

20. The semiconductor source of claim 19, wherein said means for producing and directing said beam of seed electrons comprises a voltage source for applying an electric field to said seed electrons.

21. The semiconductor source of claim 19, wherein said means for producing and directing said beam of seed electrons comprises a unit for applying a magnetic field to said seed electrons.

22. A method for obtaining emission electrons from a target comprising a wide bandgap semiconductor, said method comprising:
    a) defining a target thickness between an illumination surface and an emission surface of said target;
    b) generating a beam of seed electrons;
    c) directing said beam of seed electrons at said illumination surface;
    d) controlling an energy of said seed electrons such that said seed electrons generate electron-hole pairs in said target and a fraction of said electron-hole pairs supply said emission electrons; and
wherein said target thickness and said energy of said seed electrons are optimized such that said emission electrons are substantially thermalized at said emission surface such that an energy spread of said emission electrons at said emission surface is less than approximately 1 eV.

23. The method of claim 22, further comprising producing and directing a beam of said emission electrons to an application unit.

24. The method of claim 23, wherein said application unit is a scanning electron microscope for employing said beam of said emission electrons for scanning electron microscopy.

25. The method of claim 23, wherein said application unit is a display for employing said beam of emission electrons in an image display.

26. The method of claim 23, wherein said application unit is a lithographic device employing said beam of emission electrons for lithography.

* * * * *